(12) United States Patent
Tai et al.

(10) Patent No.: US 10,861,374 B2
(45) Date of Patent: Dec. 8, 2020

(54) DISPLAY APPARATUS

(71) Applicant: Au Optronics Corporation, Hsinchu (TW)

(72) Inventors: Ya-Hsiang Tai, Miaoli County (TW); Chi-Hao Lin, Tainan (TW); Yu-Sheng Huang, Kaohsiung (TW); Chang-Yi Li, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/739,117

(22) Filed: Jan. 10, 2020

(65) Prior Publication Data

US 2020/0152114 A1  May 14, 2020

Related U.S. Application Data

(62) Division of application No. 15/867,750, filed on Jan. 11, 2018, now Pat. No. 10,573,221.

(30) Foreign Application Priority Data

Sep. 20, 2017 (TW) .............................. 106132164 A

(51) Int. Cl.
  *G09G 3/20* (2006.01)
  *H01L 31/0296* (2006.01)
  *H01L 27/12* (2006.01)
  *H01L 31/16* (2006.01)

(52) U.S. Cl.
  CPC ......... *G09G 3/2085* (2013.01); *H01L 27/124* (2013.01); *H01L 31/02963* (2013.01); *H01L 31/161* (2013.01); *G09G 2300/02* (2013.01); *G09G 2310/0221* (2013.01); *G09G 2310/0297* (2013.01); *G09G 2310/06* (2013.01); *G09G 2320/0223* (2013.01); *G09G 2330/028* (2013.01); *G09G 2370/18* (2013.01)

(58) Field of Classification Search
  CPC ......... G09G 3/2085; G09G 2310/0221; G09G 2310/06; G09G 2330/028; G09G 2300/02; G09G 2310/0297; G09G 2370/18; G09G 2320/0223; G09G 3/20; H01L 31/02963; H01L 27/124; H01L 31/161
  See application file for complete search history.

(56) References Cited

U.S. PATENT DOCUMENTS

| | | | |
|---|---|---|---|
| 2011/0304847 A1* | 12/2011 | Mahowald | G01J 1/32 356/218 |
| 2018/0204628 A1* | 7/2018 | Gao | G11C 19/184 |

* cited by examiner

*Primary Examiner* — Sahlu Okebato
(74) *Attorney, Agent, or Firm* — JCIPRNET

(57) ABSTRACT

A display apparatus including a display panel is provided. The display panel has a plurality of display blocks, wherein each display block includes a light conversion circuit, a pixel array, and a data voltage selection circuit. The light conversion circuit receives the light pulse signal and has a pull-up circuit and a pull-down circuit, wherein the pull-up circuit and the pull-down circuit are coupled between a system high voltage and a system low voltage, and the pull-up circuit and the pull-down circuit output the system high voltage or system low voltage according to the light pulse signal to form a voltage pulse signal. The data voltage selection circuit is coupled to the light conversion circuit and the pixel array and receives an AC waveform voltage to supply a data signal to the pixel array according to the voltage pulse signal.

14 Claims, 5 Drawing Sheets

DISPLAY APPARATUS

CROSS-REFERENCE TO RELATED APPLICATION

This application is a divisional application of and claims the priority benefit of U.S. application Ser. No. 15/867,750, filed on Jan. 11, 2018, now allowed, which claims the priority benefit of Taiwan application serial no. 106132164, filed on Sep. 20, 2017. The entirety of each of the above-mentioned patent applications is hereby incorporated by reference herein and made a part of this specification.

BACKGROUND OF THE DISCLOSURE

Field of the Disclosure

The disclosure relates to a display apparatus, and particularly relates to a display apparatus using light signals.

Description of Related Art

At the present, displays are developed toward a trend of large size and high resolution, and there are two problems that need to be resolved: 1. Tracing impedances of a display panel is increased along with increase of the size of the display panel, which causes a distortion of signals on the display panel; 2. Along with increase of the resolution of the display panel, a charging time of a single row of scan line is accordingly shortened, which results in a fact that a charging capability of a current data driver probably cannot satisfy a charging demand of the display panel, i.e. pixels probably have not enough time for being charged to a target voltage, such that the pixels cannot completely display different gray level changes. Therefore, how to resolve the above problem becomes an important issue in design of large size display panels.

SUMMARY OF THE DISCLOSURE

The disclosure is directed to a display apparatus, which avoids signal distortion due to excessive impedance, and pixels have enough charging time.

The disclosure provides a display apparatus including a display panel. The display panel has a plurality of display blocks, wherein each of the display blocks includes a light conversion circuit, a pixel array, and a data voltage selection circuit. The light conversion circuit receives a light pulse signal and has a pull-up circuit and a pull-down circuit, where the pull-up circuit and the pull-down circuit are coupled between a system high voltage and a system low voltage, and the pull-up circuit and the pull-down circuit output the system high voltage or the system low voltage according to the light pulse signal to form a voltage pulse signal. The data voltage selection circuit is coupled to the light conversion circuit and the pixel array, and receives an alternating current (AC) waveform voltage to supply a data signal to the pixel array according to the voltage pulse signal.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
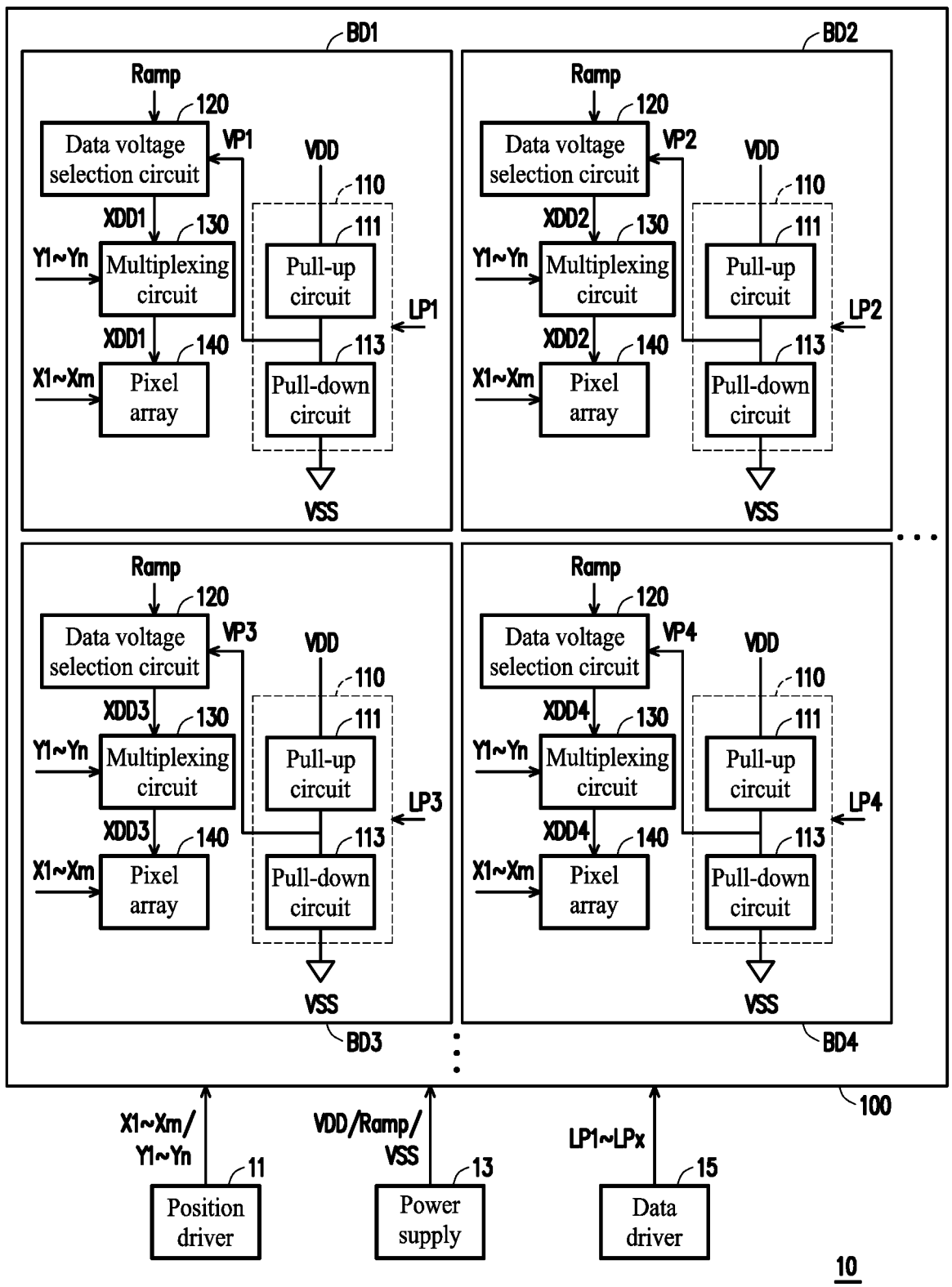
FIG. 1 is a system schematic diagram of a display apparatus according to an embodiment of the disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Moreover, "electrical connection" or "couple" can be intervening elements exist between two elements.

The terms are used herein merely for the purpose of describing a specific embodiment and shall not be restrictive. As used in the text, unless the context clearly indicates otherwise, singular terms such as "a", "one", and "the" are intended to cover plural forms and include "at least one". Also, "or" represents "and/or". As used in the text, the term "and/or" includes any and all of the combinations of one or more enumerated relevant items. It should also be understood that, when used in the specification, terms such as "comprise" and/or "include" specifically refer to the presence of a feature, a region, a whole part, a step, an operation, a component, and/or a part, but does not exclude the presence or addition of one or more other features, whole regions, steps, operations, components, parts, and/or a combination thereof.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Moreover, an acceptable range of deviation or standard deviation may be chosen for the terms "about" or "substantial" used herein based on optical properties, etching properties, or other properties, instead of applying one standard deviation across all the properties.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a system schematic diagram of a display apparatus according to an embodiment of the disclosure. Referring to FIG. 1, in the present embodiment, the display apparatus 10 includes a position driver 11, a power supply 13, a data driver 15 and a display panel 100. The position driver 11 is coupled to the display panel 100 to provide a plurality of gate driving signals X1-XM and a plurality of switch signal Y1-Yn to the display panel 100, where m and n are respectively a positive integer.

The power supply 13 is coupled to the display panel 100 to provide an alternating current (AC) waveform voltage Ramp, a system high voltage VDD and a system low voltage VSS to the display panel 100, where the AC waveform voltage Ramp may be one of a sine wave, a square wave, a triangular wave and a sawtooth wave. The data driver 15 is coupled to the display panel 100 to provide a plurality of light pulse signals LP1-LPx, where x is a positive integer.

The display panel 100 has a plurality of display blocks (for example, BD1-BD4), where an amount of the light pulse signals LP1-LPx corresponds to an amount of the display blocks (for example, BD1-BD4), i.e. x may be equal to the amount of the display blocks (for example, BD1-BD4). Each of the display blocks (for example, BD1-BD4) includes a light conversion circuit 110, a data voltage selection circuit 120, a multiplexing circuit 130 and a pixel array 140.

The light conversion circuit 110 receives the corresponding light pulse signals (for example, LP1-LPx), and has a pull-up circuit 111 and a pull-down circuit 113. The pull-up circuit 111 and the pull-down circuit 113 are coupled between the system high voltage VDD and the system low voltage VSS, and the pull-up circuit 111 and the pull-down circuit 113 output the system high voltage VDD or the system low voltage VSS according to the corresponding light pulse signals (for example, LP1-LPx) to form a corresponding voltage pulse signal (for example, VP1-VP4).

The data voltage selection circuit 120 is coupled to the light conversion circuit 110, and receives the AC waveform voltage Ramp and the corresponding voltage pulse signal (for example, VP1-VP4) to supply a corresponding data signal (for example, XDD1-XDD4) according to the corresponding voltage pulse signal (for example, VP1-VP4). The multiplexing circuit 130 is coupled to the data voltage selection circuit 120 and the pixel array 140, and receives the corresponding data signal (for example, XDD1-XDD4) and a plurality of switch signals Y1-Yn to sequentially provide the corresponding data signal (for example, XDD1-XDD4) to pixels of each column (which is described later) in the pixel array 140 according to the switch signals Y1-Yn. The pixel array 140 receives the gate driving signals X1-Xm to turn on a plurality of pixels row-by-row (which is described later). According to the above description, n corresponds to the number of columns of the pixel array 140, and m corresponds to the number of rows of the pixel array 140, and the gate driving signals X1-Xm and the switch signals Y1-Yn are used in collaboration to select a writing position (i.e. to write the pixel of the corresponding position) of the pixel array 140.

According to the above description, since the light pulse signals LP1-LPx are not transmitted by electrodes (or wires), a problem of signal attenuation is mitigated. Moreover, by dividing the display panel into blocks and simultaneously performing data writing for the blocks, a problem of inadequate writing time is mitigated.

Figure 2:
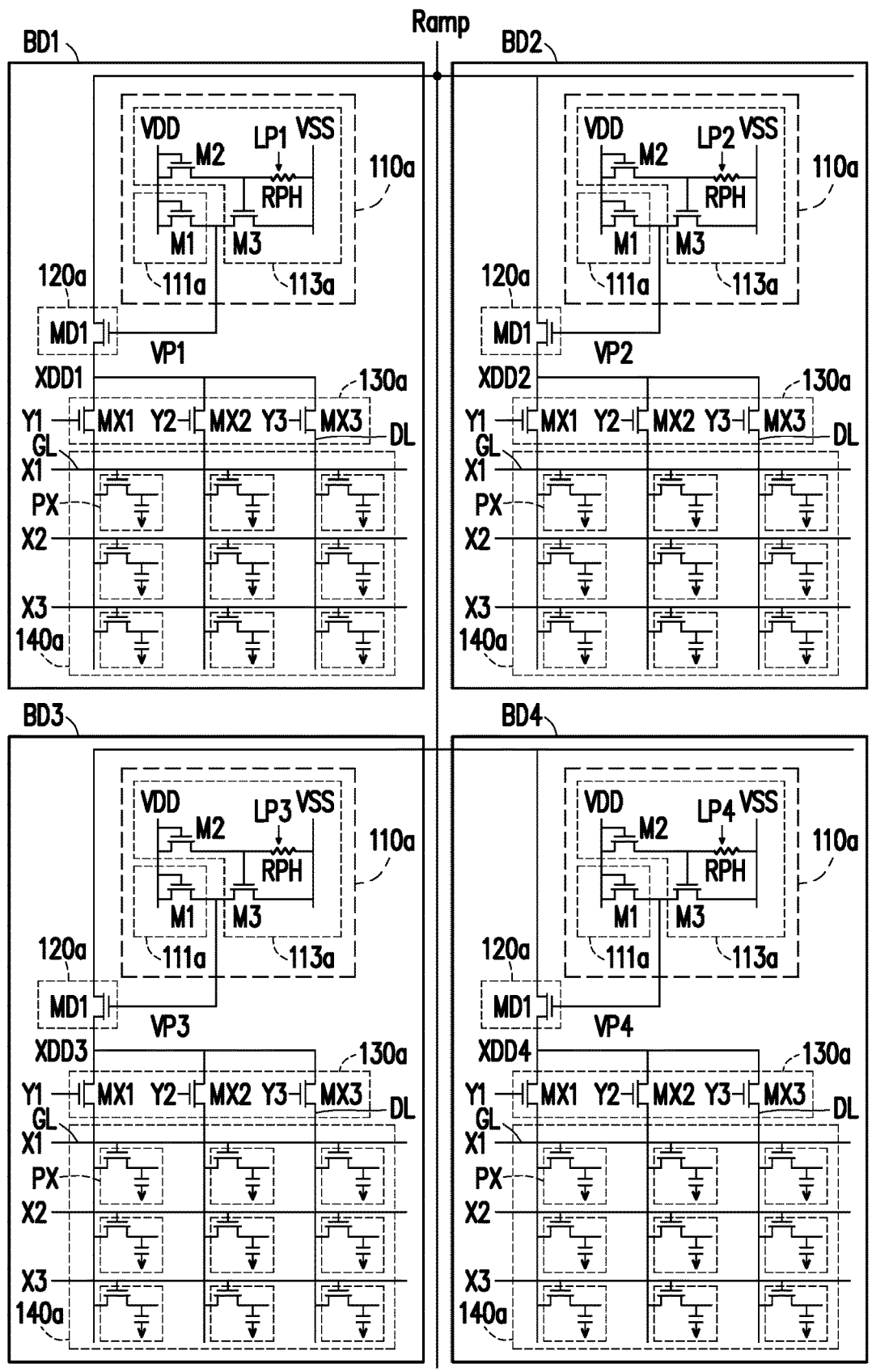
FIG. 2 is a circuit schematic diagram of a display panel according to an embodiment of the disclosure.

FIG. 2 is a circuit schematic diagram of a display panel according to an embodiment of the disclosure. Referring to FIG. 1 and FIG. 2, the display panel 100a is used for describing the display panel 100, where the same or similar devices are denoted by the same or similar referential numbers. In the present embodiment, circuit structures of the display blocks (for example, BD1-BD4) are substantially the same, and the display block BD1 is taken as an example for description, and the circuit structures of the other display blocks (BD2-BD4) may be deduced by analogy based on the description of the display block BD1.

In the present embodiment, the pull-up circuit 111a of the light conversion circuit 110a includes a transistor M1 (corresponding to a first transistor). The transistor M1 has a first terminal receiving the system high voltage VDD, a control terminal receiving the system high voltage VDD, and a second terminal coupled to the corresponding voltage pulse signal VP1.

The pull-down circuit 113a of the light conversion circuit 110a includes a photoresistor RPH, transistors M2 and M3 (corresponding to the second transistor and the third transistor). The transistor M2 has a second terminal, a first terminal receiving the system high voltage VDD, and a control terminal receiving the system high voltage VDD. The transistor M3 has a first terminal coupled to the corresponding voltage pulse signal VP1, a control terminal coupled to the second terminal of the transistor M2, and a second terminal receiving the system low voltage VSS. The photoresistor RPH is coupled between the system low voltage VSS and the control terminal of the transistor M3, and receives the corresponding light pulse signal (LP1-LP4).

When the photoresistor RPH receives the corresponding light pulse signal (LP1-LP4), the photoresistor RPH presents a low impedance, such that the transistor M3 is turned off, and a voltage level of the corresponding voltage pulse signal VP1 is substantially the system high voltage VDD. When the photoresistor RPH does not receive the corresponding light pulse signal (LP1-LP4), the photoresistor RPH presents a high impedance, such that the transistor M3 is turned on, and the voltage level of the corresponding voltage pulse signal VP1 is substantially the system low voltage VSS.

According to the above description, the transistor M1 is coupled into a transistor diode, i.e. the pull-up circuit 111a may pull up the corresponding voltage pulse signals VP1-VP4 by using the system high voltage VDD. The pull-down circuit 113a determines whether to use the system low voltage VSS to pull down the corresponding voltage pulse signal VP1 according to whether the photoresistor RPH receives the corresponding light pulse signal LP1, i.e. the pull-down circuit 113a receives the corresponding light pulse signal LP1 to determine whether to use the system low voltage VSS to pull down the corresponding voltage pulse signal VP1.

Since the pull-up circuit 111a may use the system high voltage VDD to pull up the corresponding voltage pulse signal VP1, in order to pull down the corresponding voltage pulse signal VP1, a pull-down strength of the pull-down circuit 113a is higher than a pull-up strength of the pull-up circuit 111a, i.e. a channel length to width ratio (ex. L/W) of the transistor M3 is higher than a channel length to width ratio (ex. L/W) of the transistor M1. Moreover, in order to cope with an impedance response speed of the pull-down circuit 113a, a material of the photoresistor RPH may be zinc oxide doped with magnesium, where an impedance rising time thereof is about 10 ns, and an impedance falling time is about 150 ns, though the disclosure is not limited thereto.

The data voltage selection circuit 120a includes a data transistor MD1. The data transistor MD1 has a first terminal receiving the AC waveform voltage Ramp, a control terminal receiving the corresponding voltage pulse signal VP1, and a second terminal providing the corresponding data signal XDD1. The multiplexing circuit 130a includes a plurality of switch transistors (for example, MX1-MX3), where each of the switch transistors (for example, MX1-MX3) has a first terminal coupled to the data voltage selection circuit 120a, a control terminal receiving a corresponding switch signal (for example, Y1-Y3), and a second terminal coupled to the pixel array 140a. The switch signals (for example, Y1-Y3) enable one of the switch transistors at most, i.e. the switch transistors (for example, MX1-MX3) may be all turned off, and only one of the switch transistors (for example, MX1-MX3) is turned on in time of need.

The pixel array 140a includes a plurality of pixels PX arranged in an array (for example, 3×3 array), a plurality of source lines DL and a plurality of gate lines GL. The source lines DL are sequentially coupled to the second terminals of the corresponding switch transistors (for example, MX1-MX3) in the multiplexing circuit 130a, and are respectively coupled to one column of the pixels PX. The gate lines GL receive the sequentially enabled gate driving signals (for example, the gate driving signals X1-X3), and are respectively coupled to one row of the pixels PX.

Figure 3:
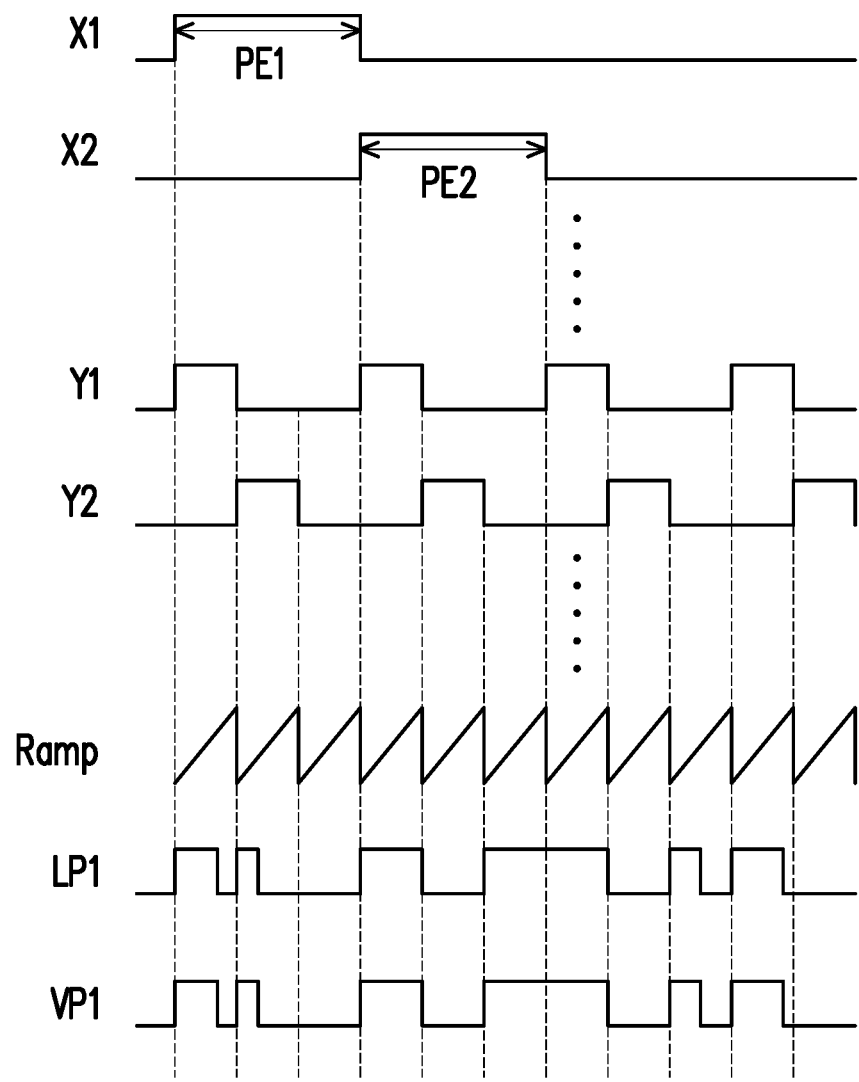
FIG. 3 is a schematic diagram of a driving waveform of the display panel according to an embodiment of the disclosure.

FIG. 3 is a schematic diagram of a driving waveform of the display panel according to an embodiment of the disclosure. Referring to FIG. 1 and FIG. 3, in the present embodiment, the display block BD1 is also taken as an example for description, where the same or similar devices are denoted by the same or similar referential numbers. In the present embodiment, the gate driving signals (for example, X1-X3) are sequentially enabled, and during an enabling period (for example, PE1, PE2) of each of the gate driving signals (for example, X1-X3), the switch signals (for example, Y1-Y3) are sequentially enabled. The enabled gate driving signals (for example, X1-X3) and the enabled switch signals (for example, Y1-Y3) may transmit the data signal XDD1 to the selected pixel PX. Since the data signal XDD1 is influenced by the voltage pulse signal VP1, and the voltage pulse signal VP1 corresponds to the light pulse signal LP1, a voltage level for writing the selected pixel PX is controlled by the light pulse signal LP1.

Figure 4:
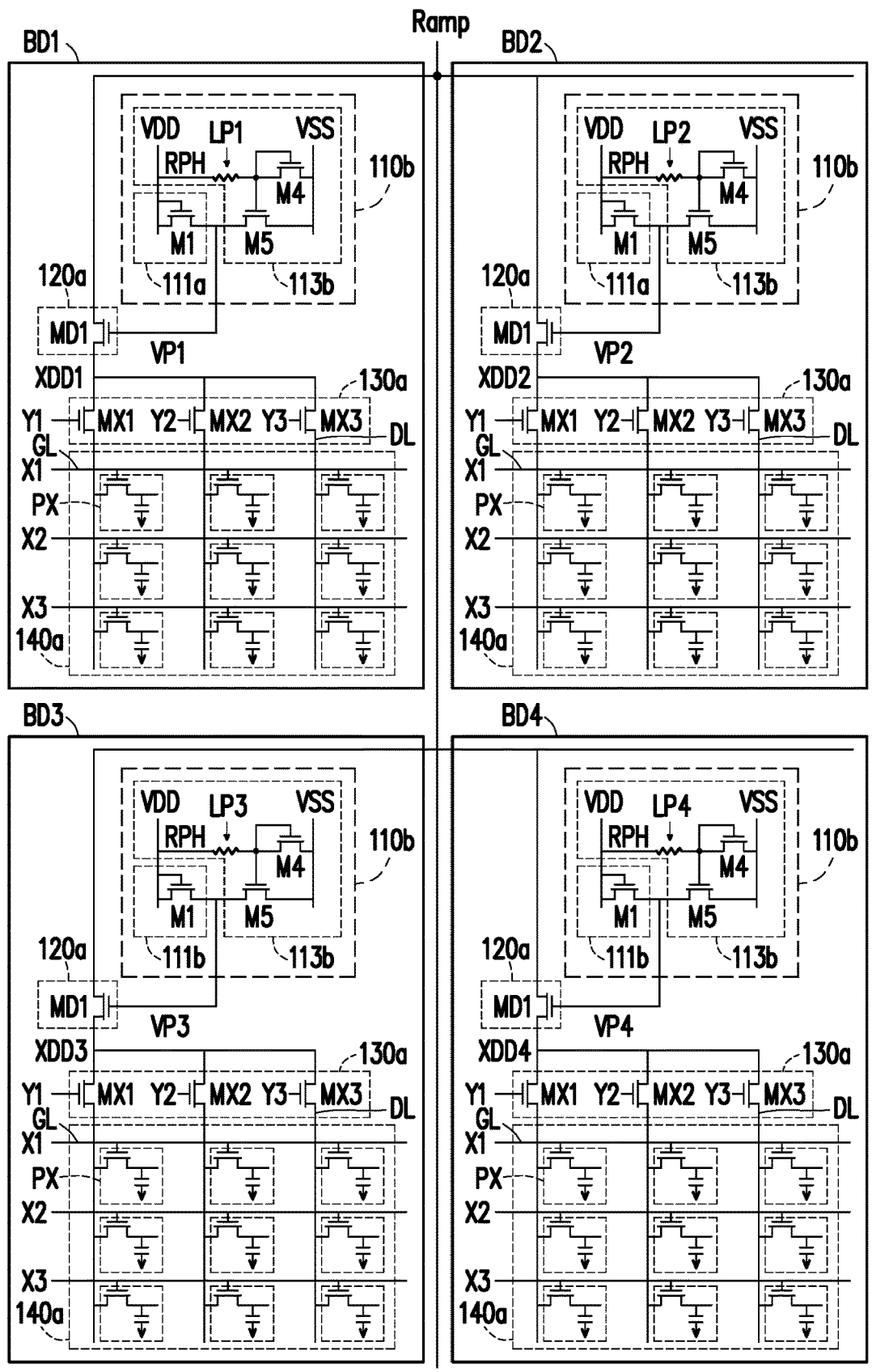
FIG. 4 is a circuit schematic diagram of a display panel according to another embodiment of the disclosure.

FIG. 4 is a circuit schematic diagram of a display panel according to another embodiment of the disclosure. Referring to FIG. 2 and FIG. 4, the display panel 100b is substantially the same to the display panel 100a, and a difference there between lies in the pull-down circuit 113b of the light conversion circuit 110b, where the same or similar devices are denoted by the same or similar referential numbers. In the present embodiment, taking the display block BD1 as an example, the pull-down circuit 113b includes a photoresistor RPH, transistors M4 and M5 (corresponding to a fourth transistor and a fifth transistor). The transistor M4 has a first terminal, a control terminal coupled to the first terminal of the transistor M4, and a second terminal receiving the system low voltage VSS. The transistor M5 has a first terminal coupled to the voltage pulse signal VP1, a control terminal coupled to the first terminal of the transistor M4 and a second terminal coupled to the system low voltage VSS. The photoresistor RPH is coupled between the system high voltage VDD and the control terminal of the transistor M4.

Figure 5:
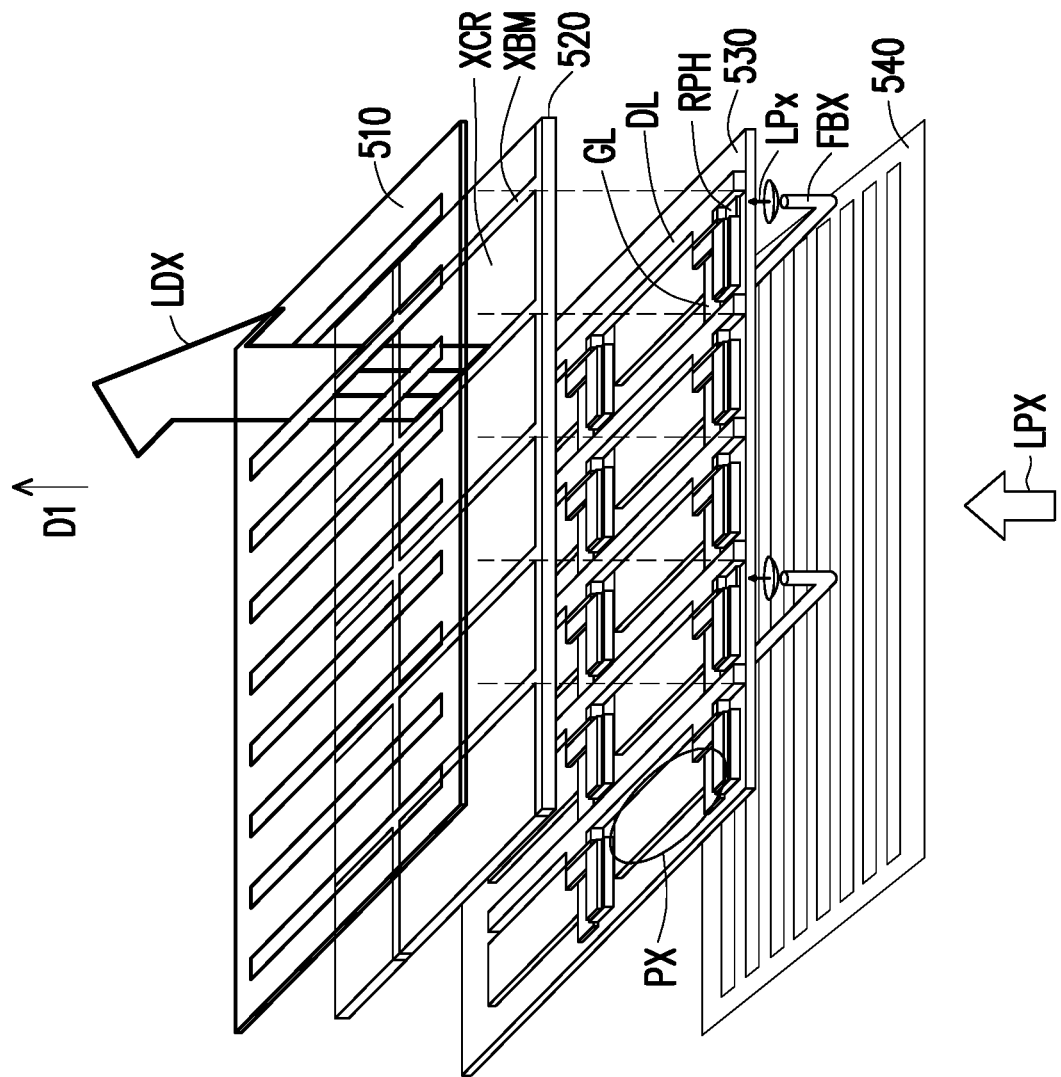
FIG. 5 is a structural schematic diagram of a display apparatus according to an embodiment of the disclosure.

FIG. 5 is a structural schematic diagram of a display apparatus according to an embodiment of the disclosure. Referring to FIG. 1, FIG. 2 and FIG. 5, in the present embodiment, the display apparatus 10 includes a first polarizing layer 510, a color conversion layer 520, an active array layer 530, a second polarizing layer 540 and a plurality of optical fibers FBX configured in a sequence. The color conversion layer 520 and the active array layer 530 are disposed between the first polarizing layer 510 and the second polarizing layer 540 to form the light conversion circuit 110, the data voltage selection circuit 120, the multiplexing circuit 130 and the pixel array 140.

The color conversion layer 520, for example color filter layer, is configured with a color conversion sheet XCR, for example color filter sheet and/or a black matrix XBM. A plane light LPX forms a display light LDX after optical processing of the second polarizing layer 540, the active array layer 530, the color conversion layer 520 and the first polarizing layer 510.

The optical fibers FBX are disposed between the active array layer 530 and the second polarizing layer for respectively transmitting the light pulse signals (for example, LP1-LPx) to the photoresistors RPH of the corresponding light conversion circuits 110a. Moreover, along a light penetration direction D1, the optical fibers FBX are covered by the black matrix XBM of the color conversion layer 520, so as to suppress an influence of the light pulse signals (LP1-LPx) on frames.

In summary, in the display apparatus of the disclosure, since the light pulse signals are not transmitted by electrodes (or wires), the problem of signal attenuation is mitigated. Moreover, by dividing the display panel into blocks and simultaneously performing data writing, a problem of inadequate writing time is mitigated. Moreover, the optical fibers used for transmitting the light pulse signals may be covered by the black matrix of the color conversion layer, so as to suppress the influence of the light pulse signals on the frame.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A display apparatus, comprising:
  a display panel, having a plurality of display blocks, wherein each of the display blocks comprising:
    a light conversion circuit, receiving a light pulse signal, and having a pull-up circuit and a pull-down circuit, wherein the pull-up circuit and the pull-down circuit are coupled between a system high voltage and a system low voltage, and the pull-up circuit and the pull-down circuit output the system high voltage or the system low voltage according to the light pulse signal to form a voltage pulse signal;
    a pixel array; and
    a data voltage selection circuit, coupled to the light conversion circuit and the pixel array, and receiving an alternating current waveform voltage to supply a data signal to the pixel array according to the voltage pulse signal,
  wherein the pull-down circuit comprises:
  a first transistor of the pull-down circuit, having a first terminal, a control terminal coupled to the first terminal of the first transistor of the pull-down circuit, and a second terminal receiving the system low voltage;
  a second transistor of the pull-down circuit, having a first terminal coupled to the voltage pulse signal, a control terminal coupled to the first terminal of the first transistor of the pull-down circuit, and a second terminal receiving the system low voltage; and a photoresistor, coupled between the system high voltage and the control terminal of the first transistor.

2. The display apparatus of claim 1, wherein the pull-up circuit uses the system high voltage to pull up the voltage pulse signal, and the pull-down circuit receives the light pulse signal to determine whether to use the system low voltage to pull down the voltage pulse signal.

3. The display apparatus of claim 1, wherein a pull-down strength of the pull-down circuit is higher than a pull-up strength of the pull-up circuit.

4. The display apparatus of claim 2, wherein the pull-up circuit comprises:

a first transistor, having a first terminal receiving the system high voltage, a control terminal receiving the system high voltage, and a second terminal coupled to the voltage pulse signal.

5. The display apparatus of claim 1, wherein a material of the photoresistor comprises zinc oxide doped with magnesium.

6. The display apparatus of claim 1, wherein the display panel comprises:

a first polarizing layer and a second polarizing layer;

a color conversion layer and an active array layer, disposed between the first polarizing layer and the second polarizing layer, and configured to form the light conversion circuit, the pixel array and the data voltage selection circuit; and a plurality of optical fibers, disposed between the active array layer and the second polarizing layer, and configured to respectively transmit the corresponding light pulse signal to the corresponding light conversion circuit.

7. The display apparatus of claim 6, wherein the optical fibers are covered by a black matrix of the color conversion layer along a light penetration direction.

8. The display apparatus of claim 1, wherein the pixel array comprises:

a plurality of pixels arranged in an array;

a plurality of source lines, sequentially coupled to the data voltage selection circuit, and respectively coupled to a column of the pixels; and a plurality of gate lines, receiving a plurality of gate driving signals enabled in a sequence, and respectively coupled to a row of the pixels.

9. The display apparatus of claim 8, wherein the display panel further comprises a multiplexing circuit coupled between the source lines and the data voltage selection circuit, and receiving a plurality of switch signals to sequentially couple the data voltage selection circuit to one of the source lines.

10. The display apparatus of claim 9, wherein the multiplexing circuit comprises a plurality of switch transistors, wherein each of the switch transistors has a first terminal coupled to the data voltage selection circuit, a control terminal receiving the corresponding switch signal, and a second terminal coupled to the corresponding source line.

11. The display apparatus of claim 9, further comprising:

a position driver, configured to provide the gate driving signals and the switch signals.

12. The display apparatus of claim 9, wherein during an enabling period of each of the gate driving signals, the switch signals are sequentially enabled.

13. The display apparatus of claim 1, wherein the data voltage selection circuit comprises a data transistor having a first terminal receiving the alternating current waveform voltage, a control terminal receiving the voltage pulse signal, and a second terminal providing the data signal.

14. The display apparatus of claim 1, wherein the alternating current waveform voltage is one of a sine wave, a square wave, a triangular wave and a sawtooth wave.

* * * * *